(12) United States Patent
Suh et al.

(10) Patent No.: US 7,705,343 B2
(45) Date of Patent: Apr. 27, 2010

(54) PHASE CHANGE RANDOM ACCESS MEMORY DEVICES AND METHODS OF OPERATING THE SAME

(75) Inventors: Dong-seok Suh, Seoul (KR);
Yong-young Park, Daejeon-si (KR);
Tae-sang Park, Suwon-si (KR);
Yoon-ho Khang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 516 days.

(21) Appl. No.: 11/443,309

(22) Filed: May 31, 2006

(65) Prior Publication Data
US 2006/0266993 A1    Nov. 30, 2006

(30) Foreign Application Priority Data
May 31, 2005    (KR)    ............ 10-2005-0046127

(51) Int. Cl.
*H01L 47/00*    (2006.01)
(52) U.S. Cl. .................. 257/4; 257/E45.002
(58) Field of Classification Search .......... 438/15, 438/25–26, 51, 55, 64, 106, 124–127; 257/678–733, 257/787–796, E23.001–E23.194, E21.499–E21.519, 257/E33.056, 4, E45.002
See application file for complete search history.

(56) References Cited

U.S. PATENT DOCUMENTS

| | | | | |
|---|---|---|---|---|
| 5,789,758 | A * | 8/1998 | Reinberg | 257/3 |
| 2003/0141531 | A1 * | 7/2003 | Aihara | 257/301 |
| 2004/0037179 | A1 * | 2/2004 | Lee | 369/47.1 |
| 2005/0227496 | A1 * | 10/2005 | Park et al. | 438/745 |
| 2006/0001017 | A1 * | 1/2006 | Chang | 257/3 |

OTHER PUBLICATIONS

Bo Liu, Ting Zhang, Jilin Xia, Zhitang Song, Songlin Feng and Bomy Chen. Nitrogen-implanted Ge2Sb2Te5 film used as multilevel storage media for phase change random access memory. Institute of Physics Publishing, Semiconductor Science and Technology, 19 (2004) L61-L64. Received Feb. 3, 2004, Published Apr. 21, 2004.*
David Michael Rowe, D. M. Rowe, Crc Handbook of Thermoelectronics, 1995, Taylor & Francis Group, pp. 333-335.*
Chinese Office Action dated Jan. 16, 2009 for Chinese Application No. 200610087668X (English translation included).

* cited by examiner

*Primary Examiner*—David Vu
(74) *Attorney, Agent, or Firm*—Harness, Dickey & Pierce, P.L.C.

(57) ABSTRACT

Provided are phase change random access memory (PRAM) devices and methods of operating the same. The PRAM device may include a switching device, a lower electrode, a lower electrode contact layer, a phase change layer and/or an upper electrode. The lower electrode may be connected to a switching device. The lower electrode contact layer may be formed on the lower electrode. The phase change layer, which may include a bottom surface that contacts an upper surface of the lower electrode contact layer, may be formed on the lower electrode contact layer. The upper electrode may be formed on the phase change layer. The lower electrode contact layer may be formed of a material layer having an absolute value of a Seebeck coefficient higher than TiAlN. The Seebeck coefficient of the lower electrode contact layer may be negative. The material layer may have lower heat conductivity and/or approximately equivalent electrical resistance as TiAlN.

29 Claims, 6 Drawing Sheets (A)

Irs < CONVENTIONAL RESET CURRENT (B)

Is = CONVENTIONAL SET CURRENT (C)

PHASE CHANGE RANDOM ACCESS MEMORY DEVICES AND METHODS OF OPERATING THE SAME

PRIORITY STATEMENT

This application claims priority under 35 U.S.C. §119 to Korean Patent Application No. 10-2005-0046127, filed on May 31, 2005, in the Korean Intellectual Property Office (KIPO), the entire contents of which are incorporated herein by reference.

BACKGROUND OF THE INVENTION

1. Field of the Invention

Example embodiments of the present invention relate to phase change random access memory (PRAM) devices and methods of operating the same.

2. Description of the Related Art

A PRAM device is a non-volatile memory device (e.g., a flash memory, ferroelectric RAM (FeRAM) and magnetic RAM (MRAM)). A PRAM device may be a memory device that writes and reads bit data using resistance characteristics of a phase change layer.

PRAMs and the other types of non-volatile memory may have some structural differences in storage nodes. In a phase transition temperature range, a PRAM storage node may use a phase change layer that changes the phase of a crystalline state of lower resistance to an amorphous state with a higher resistance. A portion of the phase change layer may contact a contact layer (e.g., a lower electrode contact layer as described below). The contact layer may contact a lower electrode. In the phase transition temperature range, the phase of a partial region of the phase change layer, which contacts the contact layer (e.g., the lower electrode contact layer), may change. The resistance characteristics of the phase change layer may change in relationship to the phase change.

FIG. 1 is a diagram illustrating a sectional view of a conventional PRAM device.

Referring to FIG. 1, a conventional PRAM device may have a transistor 2 on a silicon substrate 7. The transistor 2 may include a source region 3 and/or a drain region 4. The transistor 2 may also have a gate 5 formed on a channel region 6 between the source region 3 and the drain regions 4.

A conventional PRAM device may also include a storage node 10 connected to one of the source region 3 and the drain region 4 (e.g., the source region 3 of the transistor 2). The storage node 10 may be connected by a conductive plug 9 to the source region 3 or the drain region 4 of the transistor 2.

The storage node 10 may include a sequentially-stacked lower electrode 10a, lower electrode contact layer 10b, phase change layer 10c having written bit data and/or an upper electrode 10d. The lower electrode 10a may functions as a pad layer that provides a larger region on which the lower electrode contact layer 10b may be formed. The lower electrode contact layer 10b may contact a region restricted to a bottom surface of the phase change layer 10c.

FIG. 2 is a diagram illustrating a method for using a conventional PRAM device as shown in FIG. 1. For the sake of brevity, FIG. 2 only illustrates the storage node 10.

Referring to FIG. 2, the phase of the phase change layer 10c designates a crystalline state as a set state. At the set state, it is assumed that a bit value 0 is recorded. When a bit value 0 is recorded in the phase change layer 10c, the upper electrode 10d may apply a first phase change current $I_1$ through the phase change layer 10c on the lower electrode 10a. The first phase change current $I_1$ may have an intensity $h_1$. The first phase change current $I_1$ may correspond to a reset voltage. The first phase change current $I_1$ may change a phase of contact region A1 of the phase change layer 10c to an amorphous state. The first phase change current $I_1$ is referred to as the reset current. The contact region A1 may contact the lower electrode contact layer 10b. The first phase change current $I_1$ may be a pulse current, which has an application time of a few nanoseconds, and may have a higher current than a set current (described below in detail). The first phase change current $I_1$ may be concentrated in the lower electrode contact layer 10b which has a smaller width than the phase change layer 10c.

During application of the first phase change current $I_1$, a region of the phase change layer 10c contacting the lower electrode contact layer 10b (e.g., the "contact region A1" described above) may exhibit an increase in resistance. A temperature of the region of the phase change layer 10c may also be greater than a phase transition temperature. The phase of the contact region A1 of the phase change layer 10c may change from a crystalline state to an amorphous state. An amorphous state of the contact region A1 of the phase change layer 10c may be designated as a reset state in which it is assumed that a bit value 1 is recorded.

When the contact region A1 of the phase change layer 10c is amorphous, a second phase change current $I_2$ may be applied to the storage node 10 in the same direction as the first phase change current $I_1$. Because the second phase change current $I_2$ changes the phase of the contact region A1 of the phase change layer 10c from an amorphous state to its original crystalline state, it is referred to as the set current. The second phase change current $I_2$ may be a pulse current. The second phase change current $I_2$ may have an intensity $h_{11}$. The intensity $h_{11}$ may be lower than the intensity $h_1$ of the first phase change current $I_1$. An application time of the second phase change current $I_2$ may be equal to or greater than an application time of the first phase change current $I_1$.

While the second phase change current $I_2$ is applied to the storage node portion 10, a resistance of the contact region A1 of the phase change layer 10c may increase, and a temperature of the contact region A1 may rise. Because the intensity $h_{11}$ of the second phase change current $I_2$ is lower than $h_1$ and the application time of the second phase change current $I_2$ is longer than the application time of the first phase change current $I_1$, the temperature of the contact region A1 may remain below the phase transition temperature of the phase change layer 10c. Because the contact region A1 is heated over a longer period of time to a temperature lower than the phase transition temperature of the phase change layer 10c, the contact region A1 may change from an amorphous to a crystalline state. The entire phase change layer 10c may also be crystalline.

As described above, the resistance of the phase change layer 10c in the conventional PRAM device of FIG. 1 is determined by the first phase change current $I_1$ and second phase change currents $I_2$. The first phase change current $I_1$ (e.g., the reset current) may impede the improvement of characteristics of the PRAM device.

In light of developments in semiconductor manufacturing technology, manufacturing smaller storage nodes and transistors in order to decrease the size of the PRAM device may not be technically difficult. As the size of the transistors becomes smaller, the current that the transistors may resist (e.g., the current that the transistors may withstand) may become smaller. It may be difficult to achieve higher integration of the PRAM device without decreasing the reset current.

A method of decreasing the reset current by reducing the width of the lower electrode contact layer is acknowledged by the conventional art.

FIG. 3 is a graph illustrating the relationship between the reset current and the width of the lower electrode contact layer (e.g., a change in the size of the contact region A1 of the phase change layer) in the conventional art.

Referring to FIG. 3, the size of the contact region A1 is proportional to the reset current. Therefore, as the size of the contact region A1 decreases, the reset current may decrease.

Other methods of decreasing the reset current have been proposed such as oxidizing the lower electrode contact layer 10b and/or using a higher resistance TiAlN layer as the lower electrode contact layer 10b.

In the above methods for decreasing the reset current, the manufacturing yield and reliability of the PRAM device may decrease because the lower electrode contact layer produces an increased amount of Joule heating due to an increase in a set resistance.

SUMMARY OF THE INVENTION

Example embodiments of the present invention relate to phase change random access memory (PRAM) devices and methods of operating the same.

Example embodiments of the present invention also provide a PRAM device capable of decreasing a reset current while simultaneously decreasing or maintaining a set resistance and methods of operating the same.

According to an example embodiment of the present invention, a PRAM device may include a switching device, a lower electrode, a lower electrode contact layer, a phase change layer and/or an upper electrode. The lower electrode may be connected to the switching device. The lower electrode contact layer may be formed on the lower electrode. The phase change layer may be formed on the lower electrode contact layer. The phase change layer may include a partial region on a bottom surface thereof contacting an upper surface of the lower electrode contact layer. The upper electrode may be formed on the phase change layer.

The lower electrode contact layer may be a material layer having an absolute value of a Seebeck coefficient higher than an absolute value of TiAlN. The Seebeck coefficient of the lower electrode contact layer may be negative. The material layer may also have a heat conductivity lower than the heat conductivity of TiAlN and/or an electrical resistance approximately equivalent to TiAlN.

The lower electrode contact layer may be formed of a material having at least two properties selected from the group including an absolute value of a Seebeck coefficient higher than about 10-3000 μV/K, a heat conductivity lower than about 0.0001-1 W/cm-K, an electrical resistance of about 0.01-10000 mOhm-cm and the Seebeck coefficient of the material is a negative coefficient.

A spacer may be formed around a periphery of the lower electrode contact layer. An upper end of the lower electrode contact layer may be filled with the phase change layer.

The lower electrode contact layer may be doped with impurities. The lower electrode contact layer may be a metal, or a metalloid, doped with impurities (e.g., a SiGe layer (n-type or p-type), a PbTe layer (n-type or p-type), a polysilicon layer (n-type or p-type), a cobalt silicon layer (n-type or p-type), etc.).

The lower electrode contact layer may also be formed of one selected from the group consisting of $Sb_2Te_3$, $Bi_2Te_3$, GeTe, PbTe, SnTe and an alloy thereof. The alloy layer may be formed of at least two selected from the group consisting of Sb, Te, Bi, Ge, Pb and Sn. Although different alloy layers may have the same components, ratios of the components in the alloy layers may be different.

The alloy layer may include a desired amount of impurities. The impurities may allow the adjustment of electrical conductivity of the alloy layer to a similar level as of the electrical conductivity of TiAlN (e.g., about 1-10 milli-ohm centimeters (mOhm-cm)). The impurities in the alloy layer may be up to 10% of a weight of the alloy layer that has not been doped.

The upper electrode may be formed of TiN, TiAlN or a same material as the lower electrode contact layer. The spacer may be a silicon oxide layer, a silicon nitride layer or an aluminium oxide layer. The switching device may be a transistor or a diode-type device.

According to other example embodiments of the present invention, there is provided a PRAM device that may include a switching device, a lower electrode, an interlayer insulating layer, a first lower electrode contact layer, a second lower electrode contact layer, an insulating layer, a phase change layer and/or an upper electrode. A storage node may include the lower electrode, the interlayer insulating layer, the first lower electrode contact layer, the second lower electrode contact layer, the insulating layer, the phase change layer and/or the upper electrode.

According to other example embodiments of the present invention, a PRAM device may have at least two insulating layers. The at least two insulating layers may be interlayer insulating layers or associated layers for insulating.

The lower electrode may be connected to the switching device. The interlayer insulating layer may cover the switching device and the lower electrode. The interlayer insulating layer may have a first contact hole. The first contact hole may be formed in the interlayer insulating layer. The first contact hole may expose the lower electrode. The first lower electrode contact layer may fill the first contact hole. The second lower electrode contact layer may be formed on the interlayer insulating layer. The second lower electrode contact layer may cover an exposed portion of the first lower electrode contact layer. The insulating layer may be formed on the second lower electrode contact layer. The insulating layer may include a second contact hole that exposes the second lower electrode contact layer. The phase change layer may be formed on an upper surface of the insulating layer. The phase change layer may partially fill the second contact hole exposing the second lower electrode contact layer. The upper electrode may be formed on the phase change layer.

The first and second lower electrode contact layers may be formed of a material layer having an absolute value of a Seebeck coefficient higher than TiAlN. The Seebeck coefficient of the lower electrode contact layer may be negative. The first and second lower electrode contact layers may also be a material having lower heat conductivity than TiAlN and an electrical resistance similar to TiAlN.

The first and the second lower electrode contact layer may be formed of the same material as the lower electrode contact layer described above. A spacer may be formed around a periphery of the first lower electrode contact layer.

The first and second lower electrode contact layers may be doped with impurities. The first and second lower electrode contact layers may be a metal, or metalloid, doped with impurities (e.g., n-type SiGe layer, n-type PbTe layer, n-type polysilicon layer, cobalt silicon layer, etc.).

Alternatively, the first and second lower electrode contact layers may be formed of one selected from the group consisting of $Sb_2Te_3$, $Bi_2Te_3$, GeTe, PbTe, SnTe and an alloy thereof. The alloy layer may be formed of at least two selected from the group consisting of Sb, Te, Bi, Ge, Pb and Sn. Although different alloy layers may have the same components, ratios of the components in the alloy layers may be different.

The alloy layer may include impurities. The impurities may be adjusted to control the electrical conductivity of the alloy layer to an approximately equivalent level as TiAlN (e.g., 1-10 milli-ohm centimeters (mOhm-cm)). The impurities in the alloy layer may be up to 10% of the weight of the alloy layer that has not been doped.

The upper electrode, spacer and switching device the same as those described above.

According to other example embodiments of the present invention, there is provided a method of operating a PRAM device having a lower electrode connected to a switching device, a lower electrode contact layer formed on the lower electrode, a phase change layer provided on the lower electrode contact layer and including a partial region on a bottom surface thereof contacting an upper surface of the lower electrode contact layer and/or an upper electrode formed on the phase change layer, wherein the lower electrode contact layer is a material layer including an absolute value of a Seebeck coefficient higher than TiAlN and being negative, a heat conductivity lower than TiAlN and/or an electrical resistance approximately equivalent to TiAlN. The operating method may include applying a reset current to the phase change layer and the lower electrode contact layer to change a portion of the phase change layer that contacts the lower electrode contact layer to an amorphous state.

In this operating method, the reset current may be lower than a reset current when the TiAlN is used as the lower electrode contact layer. A spacer may be provided around the periphery of the lower electrode contact layer. The lower electrode contact layer may include an upper end filled with the phase change layer. The lower electrode contact layer may be an n-type SiGe layer, a PbTe layer, a polysilicon layer or a cobalt silicon layer. The lower electrode contact layer may also be formed of one selected from the group consisting of Sb2Te3, Bi2Te3, GeTe, PbTe, SnTe and an alloy thereof. The alloy layer may be formed of at least two selected from the group consisting of Sb, Te, Bi, Ge, Pb and Sn. Although different alloy layers may have the same components, ratios of the components in the alloy layers may be different.

After applying the reset current, a set current, which passes through the phase change layer and the lower electrode contact layer, may be applied. The set current may be applied for a longer duration than the reset current.

The switching device may be a transistor or a diode-type device.

Example embodiments of the present invention may allow the reset current to be lowered without an increase in the set resistance such that smaller transistors may be manufactured. According to other example embodiments of the present invention, integration of the PRAM device may be increased without an increase in the set resistance.

BRIEF DESCRIPTION OF THE DRAWINGS

Example embodiments of the present invention will be more clearly understood from the following detailed description taken in conjunction with the accompanying drawings. FIGS. 1-9 represent non-limiting, example embodiments of the present invention as described herein.

FIG. 1 is a diagram illustrating a sectional view of a conventional PRAM device;

FIG. 2 is a diagram illustrating a method for using a conventional PRAM device as shown in FIG. 1;

FIG. 3 is a graph illustrating the relationship between the reset current and the width of the lower electrode contact layer 10b in the conventional art;

FIG. 4 is diagram illustrating a sectional view of a PRAM device according to an example embodiment of the present invention;

FIG. 5 is a diagram illustrating a sectional view of region P1 of the PRAM device shown in FIG. 4;

FIG. 6 is a diagram illustrating a sectional view of the phase change layer of the PRAM device shown in FIG. 4 expanding toward the top of the lower electrode contact layer;

FIG. 8 is a sectional view of a PRAM device according to example embodiments of the present invention; and FIG. 9 is a diagram illustrating a method of operating a PRAM device according to example embodiments of the present invention.

DETAILED DESCRIPTION OF EXAMPLE EMBODIMENTS

Figure 1:
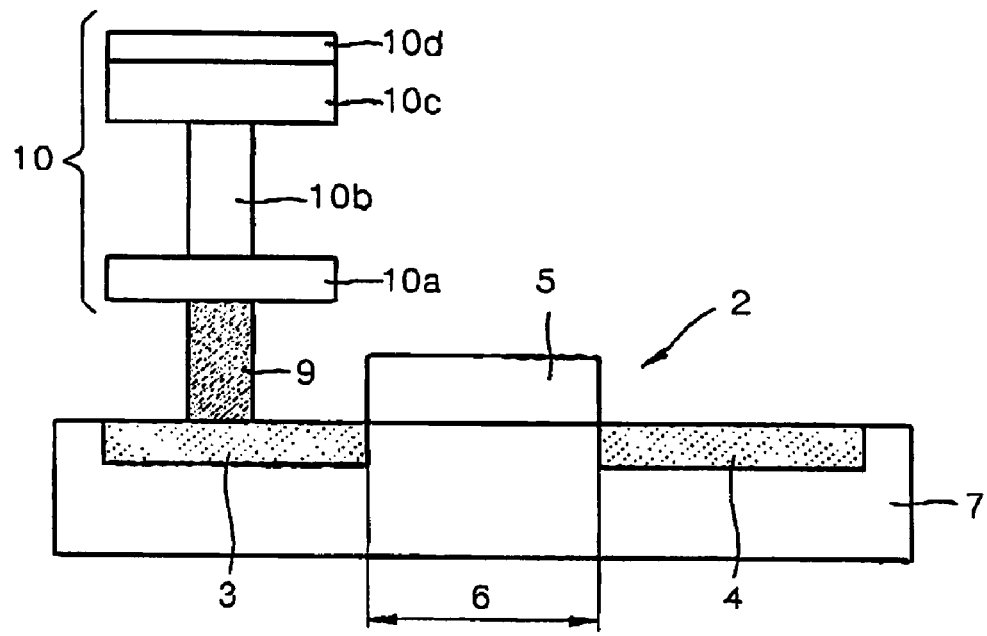

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described.

Example embodiments of the present invention relate to phase change random access memory (PRAM) devices and methods of operating the same.

A PRAM device according to example embodiments of the present invention will now be described.

Figure 4:
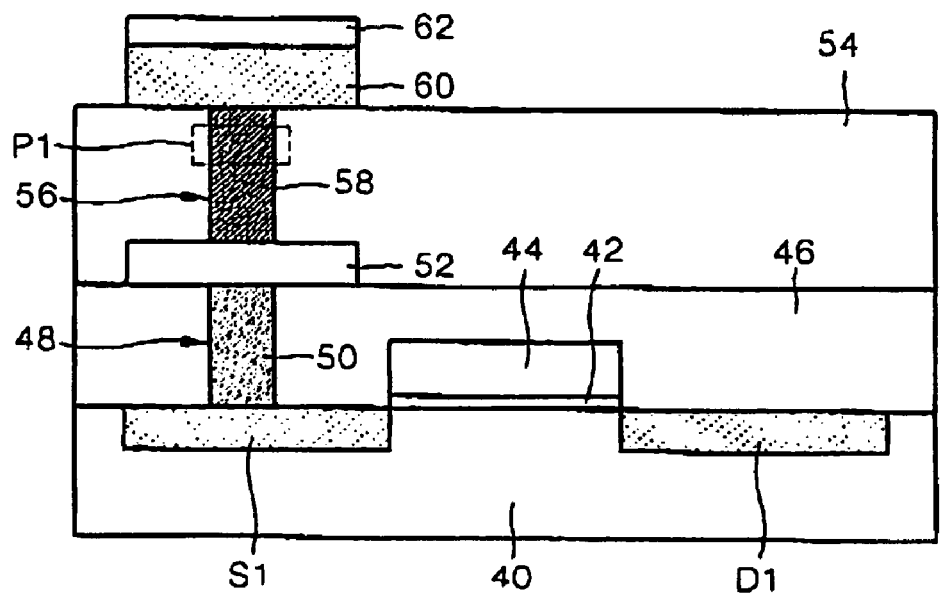

FIG. 4 is diagram illustrating a sectional view of a PRAM device according to an example embodiment of the present invention.

Referring to FIG. 4, an impurity having a desired conductivity may be implanted into a first region S1 and a second region D1 of a substrate 40. For example, the substrate 40 may be a p-type or n-type silicon substrate. The first and second impurity regions S1 and D1 may have a variety of forms. The form of the first impurity region S1 may be different from the form of the second impurity region D1. For example, the first impurity region S1 may be a source region and the second impurity region D1 may be a drain region. A gate oxidation layer 42 may be formed on the substrate 40 between the first and the second impurity regions S1 and D1. A gate 44 may be formed on the gate oxidation layer 42. The substrate 40, the gate 44 and the first and second impurity regions S1 and D1 may form an electrical field effect transistor (FET).

A first interlayer insulating layer 46 may be formed on the substrate 40 to cover the FET. A contact hole 48, for exposing the first impurity region S1, may be formed in the first interlayer insulating layer 46. Alternatively, the contact hole 48 may be formed in a location for exposing the second impurity region D1. A conductive plug 50 may fill the contact hole 48. A lower electrode 52 covering an exposed upper surface of the conductive plug 50 may be formed on the first interlayer insulating layer 46. The lower electrode 52 may also function as a pad layer. A second interlayer insulating layer 54 covering the lower electrode 52 may be formed on the first interlayer insulating layer 46. A contact hole 56 exposing an upper surface of the lower electrode 52 may be formed in the second interlayer insulating layer 54. The second interlayer insulating layer 54 may be formed of the same material as the first interlayer insulating layer 46. The contact hole 56 may be filled by a lower electrode contact layer 58.

According to other example embodiments of the present invention, a PRAM device may have at least two insulating layers. The at least two insulating layers may be interlayer insulating layers or associated layers for insulating.

The lower electrode contact layer 58 may be formed of a material having a more favourable Peltier effect than a lower electrode contact layer using titanium aluminium nitride TiAlN, similar resistance to TiAlN and/or lower heat conductivity than TiAlN. The lower electrode contact layer 58 having these characteristics will now be described.

A phase change layer 60 may be formed on the second interlayer insulating layer 54 such that the phase change layer 60 covers an exposed upper surface of the lower electrode contact layer 58. The phase change layer 60 may be formed of $Ge_2Sb_2Te_5$ doped with nitrogen.

An upper electrode 62 may be formed on the phase change layer 60. The upper electrode 62 may be formed of titanium nitride (TiN) or TiAlN.

Figure 5:
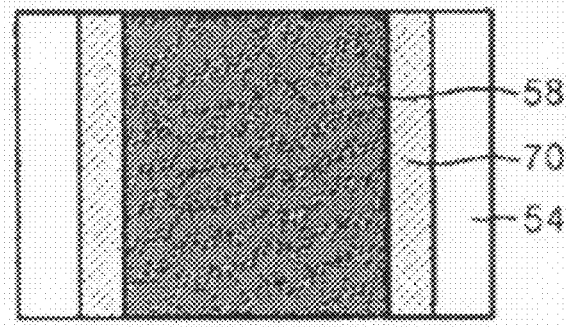

FIG. 5 is a diagram illustrating a sectional view of region P1 of the PRAM device shown in FIG. 4.

Referring to FIG. 5, a spacer 70 may be formed between the lower electrode contact layer 58 and the second interlayer insulating layer 54. The spacer 70 may decrease the size of the contact hole 56. The spacer 70 may vary depending on the material used for the lower electrode contact layer 58. The spacer 70 may be formed of SiN, $SiO_2$, $Al_2O_3$, or SiON.

Figure 6:
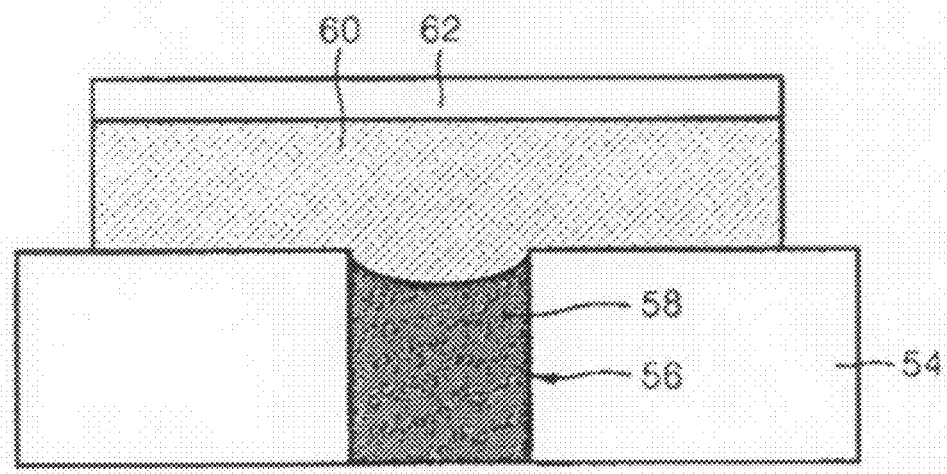

FIG. 6 is a diagram illustrating a sectional view of the phase change layer of the PRAM device shown in FIG. 4 expanding into the contact hole 56.

As shown in FIG. 6, the top of the contact hole 56 may be filled by the phase change layer 60. For example, a portion of the contact hole 56 may be filled by the lower electrode contact layer 58 and a smaller portion of the contact hole 56 may be filled by a region of the phase change layer 60.

The material characteristics of the lower electrode contact layer 58 will be further described.

As a reset current is applied to the phase change layer 60, heat may be generated in a partial region of the phase changing layer 60 contacting the lower electrode contact layer 56. Because heat causes the temperature of the partial region of the phase changing layer 60 to rise above the phase change temperature, a portion of the phase change layer 60 may also be changed from a crystalline to an amorphous state. As the reset current is applied to the phase change layer 60, the total heat generated in the partial region of the phase changing layer 60 may be affected by Joule heating, heat loss from conduction and/or the Peltier effect. The resulting heat is hereinafter referred to as 'Peltier heat.'

Because Peltier heat depends on the Peltier effect, the Peltier heat is independent from changes in the set resistance that may result from changes in the size of the lower electrode contact layer 58. When the Peltier heat is increased, the total heat generated in the partial region of the phase change layer 60 may be increased, without an increase in the set resistance. In other words, the reset current may decrease in proportion to the increase in the total heat generated by the Peltier heat.

The Peltier heat is proportional to the difference $\Delta S$ between a Seebeck coefficient SB1 of the phase change layer 60 and a Seebeck coefficient SB2 of the lower electrode contact layer 58 ($\Delta S = SB1 - SB2$).

Because materials used to form the phase change layer 60 remain the same, the Peltier heat may depend on the material used for the lower electrode contact layer 58. Specifically, the Peltier heat increases as the difference increases ($\Delta S > 0$, when the Seebeck coefficient SB2 of the lower electrode contact layer 58 has a negative value and the absolute value of the Seebeck coefficient SB2 is higher than the Seebeck coefficient SB1 of the phase change layer 60). In order to increase the Peltier heat, consideration should be made regarding the heat conductivity and electrical resistance of the determined material when the material for the lower electrode contact layer 58 is determined.

At a melting point of the phase change layer 60 (e.g., the temperature near the point where the partial region of the phase change layer 60 changes from a crystalline to an amorphous state) or a lower temperature, if the Seebeck coefficient SB2 of the lower electrode contact layer 58 has a negative value, the lower electrode contact layer 58 may be formed of a material that has an absolute value of the Seebeck coefficient SB2 greater than TiAlN. The heat conductivity of the material may also be lower than TiAlN and an electrical resistance similar to TiAlN.

When the phase change layer 60 is formed of $Ge_2Sb_2Te_5$ (GST), the lower electrode contact layer 58 may be formed with one of an n-type SiGe layer, an n-type PbTe layer, an n-type polysilicon layer and an n-type cobalt silicon (n-Co-$Si_x$) layer. The lower electrode contact layer 58 may be formed of one selected from a group consisting of $Sb_2Te_3$, $Bi_2Te_3$, GeTe, PbTe, SnTe and an alloy thereof.

The alloy layer may include at least two selected from a group consisting of Sb, Te, Bi, Ge, Pb and Sn. Different alloy layers may have the same or different components. Although different alloy layers may have similar components, ratios of the components in the alloy layers may be different.

The alloy layer may be doped with impurities. The impurities may determine the electrical conductivity of the alloy layer. The electrical conductivity of the alloy layer may be adjusted to a level approximately equivalent to TiAlN (e.g., about 1-10 milli-ohm centimeters (mOhm-cm). The impurities may be up to 10% of the weight of an alloy layer that has not been doped.

The lower electrode contact layer 58 may also be formed of $CeFe_{4-X}Co_xSb_{12}$. When the melting point of the material used for the phase change layer 60 is different from GST, the lower electrode contact layer 58 may be formed of a different material than described above.

The lower electrode contact layer 58 may be determined by comparing a TiAlN layer used for a lower electrode contact layer in a conventional PRAM device with a lower electrode contact layer (e.g., a SiGe layer) described in accordance with example embodiments of the present invention. For example, TiAlN may be compared to SiGe wherein n-$Si_{0.7}Ge_{0.3}$ is used.

Table 1 summarizes the respective properties in terms of electrical resistance, Seebeck coefficient, and heat conductivity of TiAlN and n-$Si_{0.7}Ge_{0.3}$. The values in Table 1 may be modified by doping. The values reflect approximate values.

TABLE 1

| Material Type | Electrical Resistance (mOhm-cm) | Seebeck Coefficient (μV/K) | Heat Conductivity (W/cm·K) |
|---|---|---|---|
| TiAlN | 1-4 | 10 | 0.3 |
| n-$Si_{0.7}Ge_{0.3}$ | 1-8 | −100~−300 | 0.04 |

Referring to Table 1, the electrical resistance values of TiAlN and n-$Si_{0.7}Ge_{0.3}$ are within the same approximate range. The absolute value of the Seebeck coefficient of n-$Si_{0.7}Ge_{0.3}$ is higher than TiAlN. The Seebeck coefficient of n-$Si_{0.7}Ge_{0.3}$ also has a negative value. The lower electrode contact layer of n-$Si_{0.7}Ge_{0.3}$ has a lower heat conductivity value than TiAlN.

Under these conditions, the lower electrode contact layer according to example embodiments of the present invention may exhibit a larger Peltier effect, lower heat conductivity and similar electrical conductivity than a lower electrode contact layer of TiAlN used in a conventional PRAM device.

Because the reset current may be lowered in proportion to an increase in Peltier heat, a PRAM device having a lower electrode contact layer 58 in accordance with example embodiments of the present invention may also exhibit an increased amount of Peltier heat compared to a conventional lower electrode contact layer of TiAlN. Because it is not necessary to change the size of the lower electrode contact layer 58, the probability of problems occurring due to an increase in set resistance may be lower.

Figure 7A:
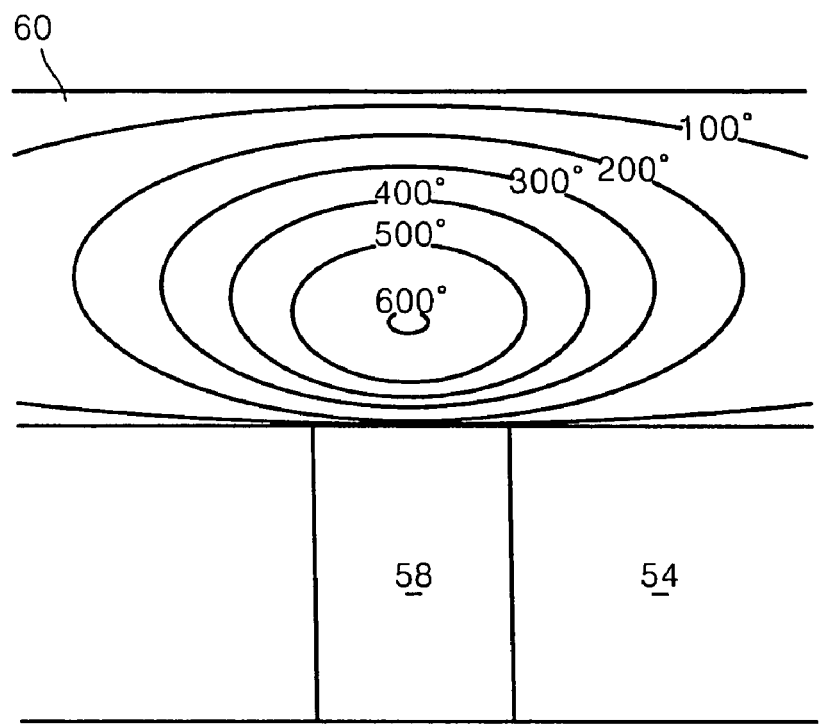
FIG. 7A is a diagram illustrating the temperature distribution of phase change layer of a conventional PRAM device (hereinafter 'first PRAM device') having a TiAlN lower electrode contact layer wherein a reset current is applied to the first PRAM device.

FIG. 7A is a diagram illustrating the temperature distribution of phase change layer of a conventional PRAM device (hereinafter 'first PRAM device') having a TiAlN lower electrode contact layer wherein a reset current is applied to the first PRAM device.

Figure 7B:
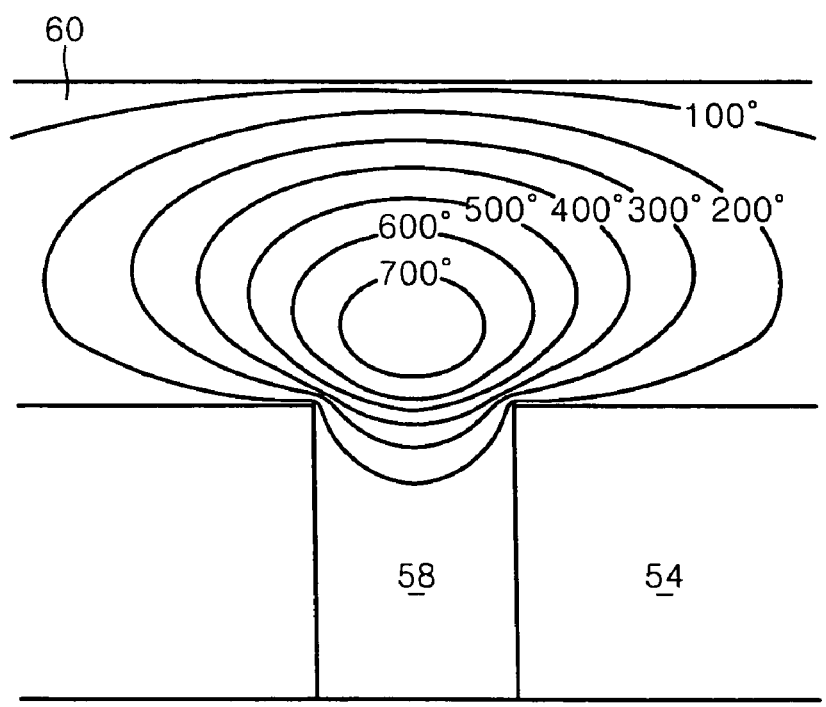
FIG. 7B is a diagram illustrating the temperature distribution of phase change layer of a PRAM device (hereinafter 'second PRAM device') having a n-type SiGe lower electrode contact layer in accordance with example embodiments of the present wherein the same reset current as applied to the first PRAM device is applied to the second PRAM device.

FIG. 7B is a diagram illustrating the temperature distribution of phase change layer of a PRAM device (hereinafter 'second PRAM device') having a n-type SiGe lower electrode contact layer in accordance with example embodiments of the present wherein the same reset current as applied to the first PRAM device is applied to the second PRAM device.

As shown in FIGS. 7A and 7B, if the same reset current is applied, the second PRAM device (e.g., 100° C.-700° C.) has a larger temperature distribution than the first PRAM device (e.g., 100° C.-600° C.). A core of the phase change layer 60 of the second PRAM device also has a higher temperature (e.g., 700° C.) than the first PRAM device (e.g., 600° C.). The core of the phase change layer 60 of the second PRAM device may also closer to the lower electrode contact layer 58 than the first PRAM device. In other words, the temperature of the phase change layer 60 closest to the lower electrode contact layer 58 may be higher in the second PRAM device than in the first PRAM device.

The reset current for the second PRAM device may be decreased in comparison to the reset current for the first PRAM device.

Figure 8:
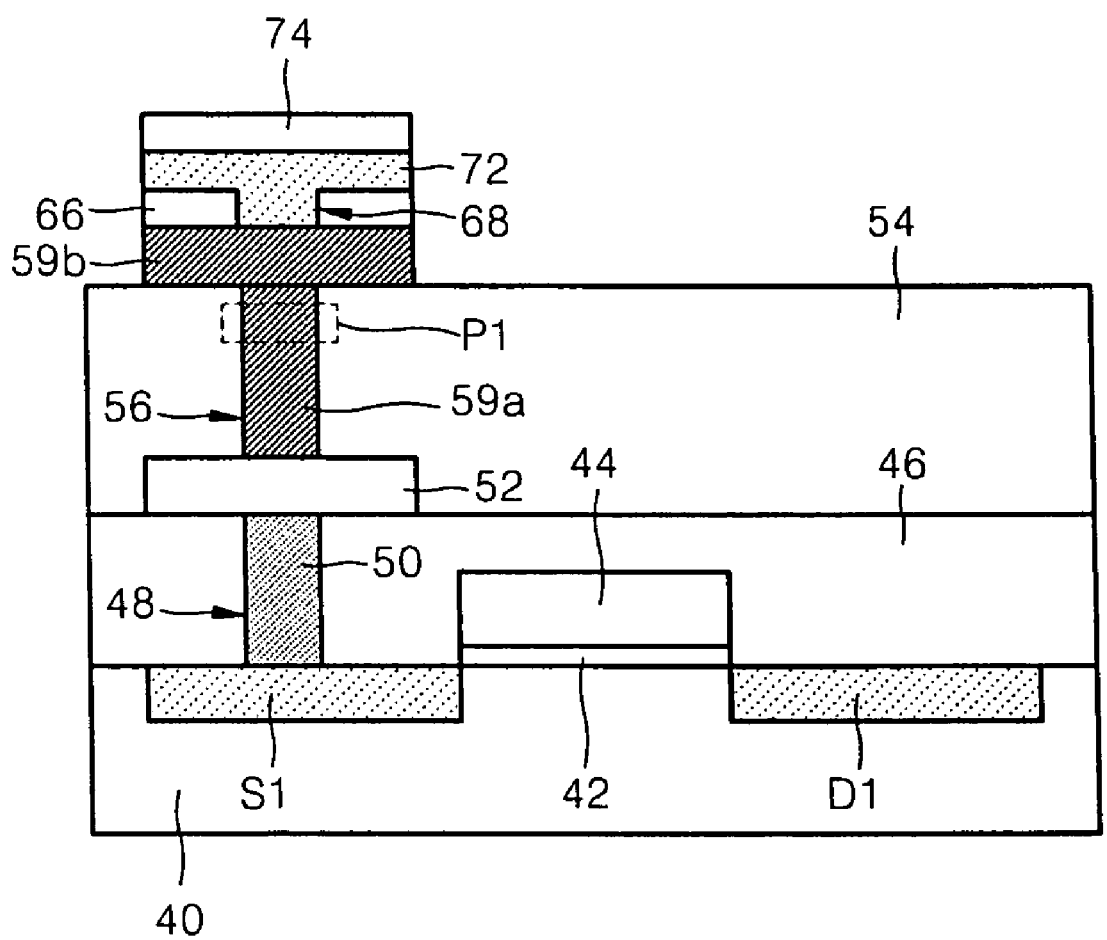

FIG. 8 is a diagram illustrating a sectional view of a PRAM device according to other example embodiments of the present invention. For the sake of brevity, description of similar portions of the PRAM device illustrated in FIG. 4 will be omitted.

Referring to FIG. 8, a PRAM device may include a second lower electrode contact layer 59b that may be formed flat over a region of a second interlayer insulating layer 54 and a lower portion of a phase change layer 72 that is restricted by a third interlayer insulating layer 66. The phase change layer 72 may be formed in a T-shape such that a second lower portion thereof contacts the lower electrode contact layer 59b. An interface surface between the lower electrode contact layer 59b and the phase change layer 72 may be separated by the third interlayer insulating layer 66.

As shown in FIG. 8, a contact hole 56 may be formed in a second interlayer insulating layer 54 and filled by a first lower electrode contact layer 59a. A spacer (not shown) may be formed at the periphery, or edges, of the first lower electrode contact layer 59a. The second lower electrode contact layer 59b may be formed to cover an exposed portion of the first lower electrode contact layer 59a. The first and the second lower electrode contact layers 59a and 59b may be formed of the same material, or of different materials. The material forming the first and the second lower electrode contact layers 59a and 59b may be the same material as the material forming the lower electrode contact layer 58 of the PRAM device described with reference to FIG. 4.

The first and the second lower electrode contact layers 59a and 59b may be formed in a single manufacturing process. Alternatively, the second lower electrode contact layer 59b may be formed after the formation of the first lower electrode contact layer 59a.

The third insulating layer 66 may be formed on the second lower electrode contact layer 59b. A contact hole 68 for exposing a desired region of the second lower electrode contact layer 59b may be formed in the third insulating layer 66. A phase change layer 72 may fill the contact hole 68. An upper electrode 74 may be formed on the phase change layer 72.

The phase change layer 72 may be formed of the same material as the phase change layer 60 described with reference to the PRAM device shown in FIG. 4. Alternatively, the phase change layer 72 may be formed of a different material than the phase change layer 60. For example, in other example embodiments of the present invention, the phase change layers 60 and 72 may be formed of a transition metal oxide having multiple resistance states, as described above. For example, the phase change layers may be formed of at least one material selected from the group consisting of NiO, $TiO_2$, HfO, $Nb_2O_5$, ZnO, $WO_3$, and CoO or $Ge_2Sb_2Te_5$ (GST) or PCMO ($Pr_xCa_{1-x}MnO_3$). The phase change layers may be a compound including one or more elements selected from the group consisting of S, Se, Te, As, Sb, Ge, Sn, In and Ag.

In other example embodiments, the phase change layers may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change layers may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change layers may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (C—Sb—Se).

Although the phase change layer is described above as being formed primarily of ternary phase-change chalcogenide alloys, the chalcogenide alloy of the phase change layer could be a binary phase-change chalcogenide alloy or a quaternary phase-change chalcogenide alloy. Example binary phase-change chalcogenide alloys may include one of Ga—Sb, In—Sb, In—Se, $Sb_2$—$Te_3$ and Ge—Te alloys; example quaternary phase-change chalcogenide alloys may include one of an Ag—In—Sb—Te, (Ge—Sn)—Sb—Te, Ge—Sb—(Se—Te) and $Te_{81}$—$Ge_{15}$-$Sb_2$—$S_2$ alloy, for example.

As shown in FIGS. 4 and 8, the transistor may be used as a switching device. Alternatively, the switching device may be another device such as a diode-type switching device.

Figure 9:
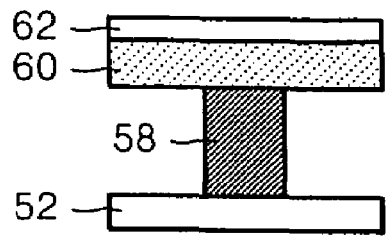
Figure 9:
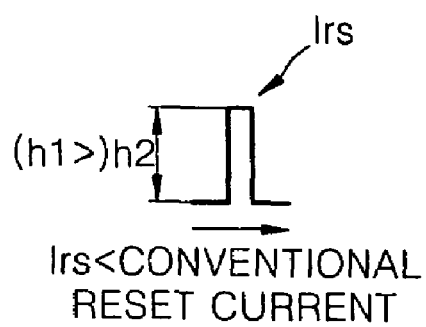
Figure 9:
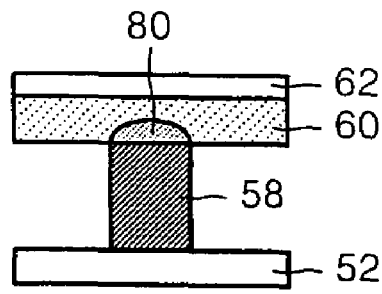
Figure 9:
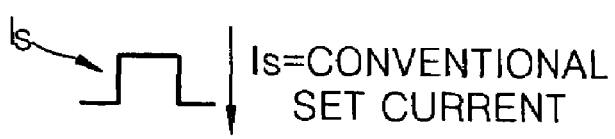
Figure 9:
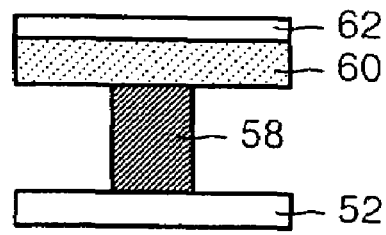

FIG. 9 is a diagram illustrating a method of operating a PRAM device according to example embodiments of the present invention. The transistor described herein is in a constant 'on' state as such the switching device (e.g., the transistor or a diode) has been omitted from FIG. 9 for the sake of brevity.

Figure 2:
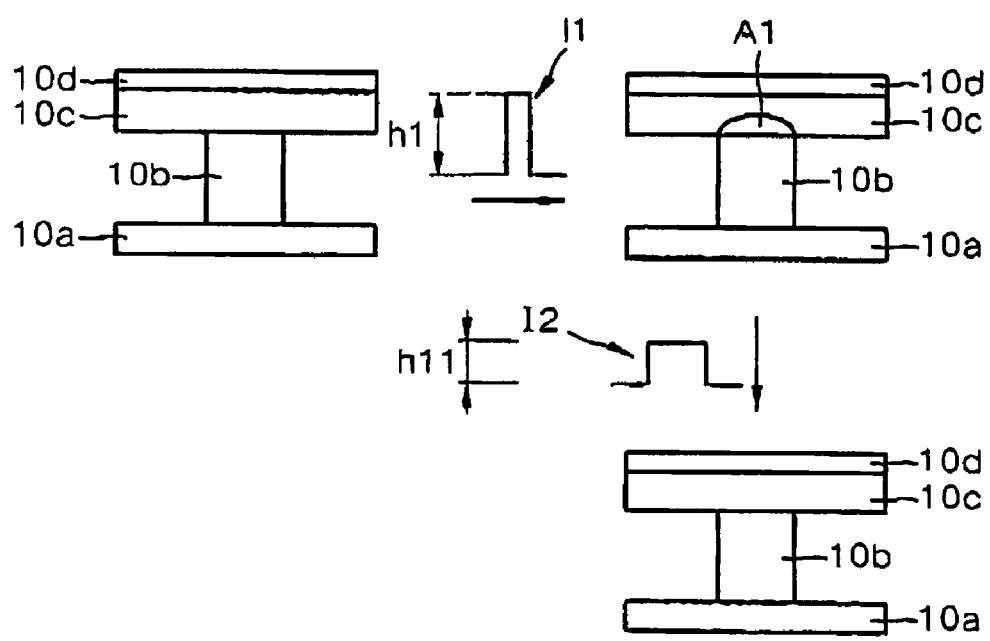
Figure 3:
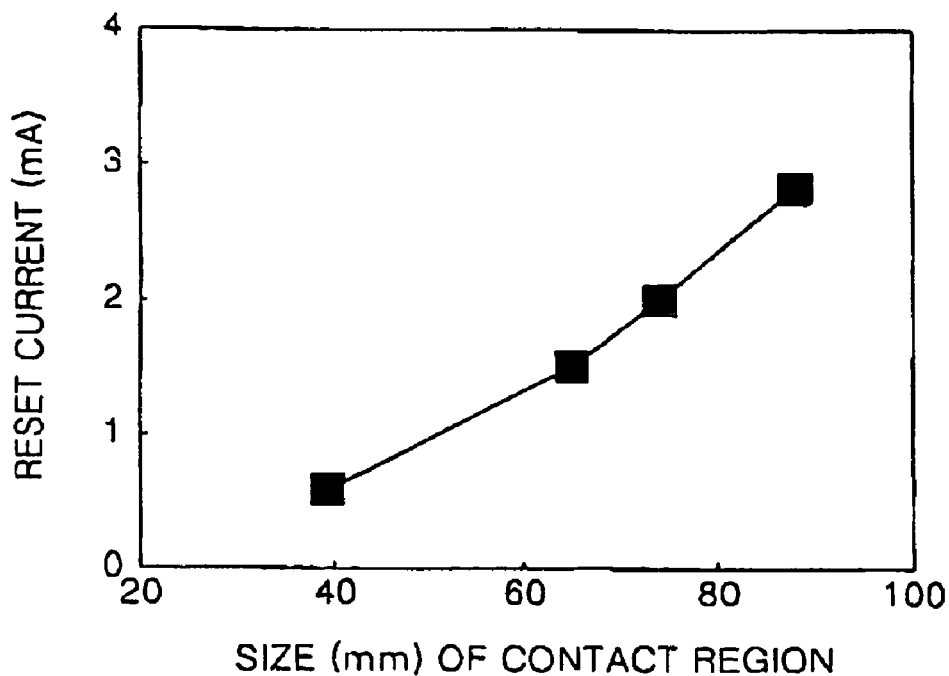

As illustrated in FIG. 9a, a reset current $I_{rs}$ may be applied over a desired duration (e.g., a few nanoseconds) to a crystallized phase change layer 60. Because a larger amount of Peltier heat may be generated by a lower electrode contact layer 58 formed in accordance with example embodiments of the present invention compared to a conventional lower electrode contact layer, the reset current $I_{rs}$ may be smaller than the first phase change current $I_1$ described with reference to FIG. 2. For example, for a 16 Mb PRAM device, a reset current of 1.6 mA may be needed in the conventional art. A reset current $I_{rs}$ less than 1.6 mA may be needed according to example embodiments of the present invention. For a 64 Mb PRAM device, the conventional art may need a reset current is of around 1.1 mA. Example embodiments of the present invention may need a reset current $I_{rs}$ of less than 1.1 mA. In a higher integration device, the reset current $I_{rs}$ according to example embodiments of the present invention may be lesser than a conventional reset current. Reference $h_2$ in FIG. 9 represents an intensity, or magnitude, of the reset current $I_{rs}$. The intensity $h_2$ may be lower than the intensity $h_1$ of a conventional reset current $I_1$ shown in FIG. 2.

As the reset current $I_{rs}$ is applied to the phase change layer 60 a temperature of the region of the phase change layer 60 contacting the lower electrode contact layer 58 may rise above the phase shift temperature. As shown in FIG. 9b, the region of the phase change layer 60 may become an amorphous region 80. As the region of the phase change layer 60 becomes an amorphous region 80, the electrical resistance of the phase change layer 60 may increase.

When the partial region of the phase change layer 60 is in the amorphous state, the PRAM device may assume that a bit value 1 has been written. When the region of the phase change layer 60 is in a crystalline state, the PRAM device may assume that a bit data 0 has been written.

Referring to FIG. 9b, when the amorphous region 80 is disposed on the phase change layer 60, a set current $I_s$ having a smaller intensity than the reset current $I_{rs}$ of the phase change layer 60 may be applied. The set current $I_s$ may be applied over a longer duration than the reset current $I_{rs}$.

As the set current $I_s$ is applied, the amorphous region 80 of the phase change layer 60 may crystallize. As shown in FIG. 9c, when the amorphous region 80 of the phase change layer crystallizes, the entire, or a substantial portion of, phase change layer 60 may also crystallize. The physical states of the phase change layer 60 in FIGS. 9c and 9a are the same. The application of the set current $I_s$ to the phase change layer 60 shown in FIG. 9b may be to delete a bit value 1 written to the phase change layer 60 or to write a bit value 0 to the phase change layer 60.

In reading a bit value, when a current large enough not to change the phase of the phase change layer 60 is applied to the phase change layer 60, it may be determined whether the measured resistance is larger or smaller such that it may be determined whether the bit data recorded in the phase change layer 60 is 1 or 0. During reading, the current applied to the phase change layer 60 may be lower than the reset current $I_{rs}$ and the set current $I_s$.

The above-described method of operation may be applied to the PRAM device illustrated in FIG. 8.

The lower electrode contact layer 58 may be formed of a material having a larger Peltier effect than the above-described material. The phase change layer 60 may be formed of a material other than GST. An operating method may be used wherein the reset current and the set current may be applied in an opposite direction.

As described above in accordance with example embodiments of the present invention, the PRAM device may include a lower electrode contact layer that contacts a lower surface of a phase change layer. The lower electrode contact layer provided is formed of a material having a larger absolute value of a Seebeck coefficient, a negative Seebeck coefficient value, lower heat conductivity and approximately equivalent electrical resistance. Because the material provided may have a larger absolute value of a Seebeck coefficient, a larger amount of Peltier heat may be generated.

According to other example embodiments of the present invention, a reset current of a PRAM device may decrease in proportion to the amount of Peltier heat generated. Generation of a larger amount of Peltier heat allows the current limit to be lower and the size of the transistor to be smaller, allowing for increased integration of the PRAM device.

According to yet other example embodiments of the present invention, a reduction of the reset current in the PRAM device may be due to the Peltier effect. The reduction of the reset current may be independent of a decrease in size of the lower electrode contact layer. It may be possible to increase the integration of the PRAM device while maintaining, or decreasing, the set resistance.

While the present invention has been particularly shown and described with reference to example embodiments thereof, various changes in form and details may be made therein without departing from the spirit and scope of the present invention as defined by the following claims.

What is claimed is:

1. A phase change random access memory (PRAM) device comprising:
   a switching device;
   a lower electrode connected to the switching device;
   a first lower electrode contact layer formed on the lower electrode;
   a phase change layer wherein the first lower electrode contact layer is formed between the phase change layer and the lower electrode; and
   an upper electrode formed on the phase change layer,
   wherein the first lower electrode contact layer is formed of a material having all of the following properties:
      an absolute value of a Seebeck coefficient of about 10-3000 µV/K,
      a heat conductivity of about 0.0001-1 W/cm-K,
      an electrical resistance of about 0.01-10000 mOhm-cm, and
      the Seebeck coefficient of the material is a negative coefficient.

2. The PRAM device of claim 1, wherein the phase change layer is formed on the first lower electrode contact layer and includes a partial region of a bottom surface thereof contacting an upper surface of the first lower electrode contact layer.

3. The PRAM device of claim 1, wherein the switching device is a transistor or a diode-type device.

4. The PRAM device of claim 1, wherein the phase change layer fills an upper end of the first lower electrode contact layer.

5. The PRAM device of claim 4, wherein the first lower electrode contact layer is one selected from the group consisting of an n-type SiGe layer, a PbTe layer and a cobalt silicon layer.

6. The PRAM device of claim 4, wherein the first lower electrode contact layer is one selected from the group consisting of an $Sb_2Te_3$ layer, a $Bi_2Te_3$ layer, a GeTe layer, a PbTe layer and an SnTe layer.

7. The PRAM device of claim 1, wherein the first lower electrode contact layer is formed of one selected from the group consisting of an n-type SiGe layer, a PbTe layer and a cobalt silicon layer.

8. The PRAM device of claim 1, wherein the first lower electrode contact layer is formed of one selected from the group consisting of $Sb_2Te_3$, $Bi_2Te_3$, GeTe, PbTe, SnTe and an alloy thereof.

9. The PRAM device of claim 8, wherein the alloy is formed of at least two selected from the group consisting of Sb, Te, Bi, Ge, Pb and Sn.

10. The PRAM device of claim 9, wherein the alloy is doped with a desired amount of impurities.

11. The PRAM device of claim 1, wherein the upper electrode is formed of one selected from the group consisting of TiN, TiAlN and a same material as the first lower electrode contact layer.

12. The PRAM device of claim 1, further comprising:
an interlayer insulating layer covering the switching device and the lower electrode, wherein the interlayer insulating layer has a contact hole formed thereon exposing the lower electrode.

13. The PRAM device of claim 1, further comprising:
a second lower electrode contact layer covering an exposed portion of the first lower electrode contact layer, wherein the second lower electrode contact layer is formed between the phase change layer and the first lower electrode contact layer.

14. The PRAM device of claim 1, further comprising:
an interlayer insulating layer covering the switching device and the lower electrode wherein the interlayer insulating layer having a first contact hole formed thereon, the first contact hole exposing the lower electrode;
a second lower electrode contact layer formed on the interlayer insulating layer and covering an exposed portion of the first lower electrode contact layer; and
an insulating layer formed on the second lower electrode contact layer wherein the insulating layer having a second contact hole formed thereon, the second contact hole exposing the second lower electrode contact layer, wherein the second lower electrode contact layer is formed of the material, the phase change layer is formed on an upper surface of the insulating layer and filling the second contact hole and the first lower electrode contact layer fills the first contact hole.

15. The PRAM device of claim 14, wherein the first and second lower electrode contact layers are formed of one selected from the group consisting of an n-type SiGe layer, a PbTe layer, a polysilicon layer and a cobalt silicon layer.

16. The PRAM device of claim 14, wherein the first and second lower electrode contact layers are formed of one selected from the group consisting of $Sb_2Te_3$, $Bi_2Te_3$, GeTe, PbTe, SnTe and an alloy thereof.

17. The PRAM device of claim 16, wherein the alloy is formed of at least two selected from a group consisting of Sb, Te, Bi, Ge, Pb, and Sn.

18. The PRAM device of claim 17, wherein the alloy is doped with a desired amount of impurities.

19. The PRAM device of claim 14, wherein the first and second lower electrode contact layers are doped with a desired amount of impurities.

20. The PRAM device of claim 14, wherein the upper electrode is formed of one selected from the group consisting of TiN, TiAlN and a same material as the first and second lower electrode contact layers.

21. A method of operating the PRAM device of claim 14, comprising applying a reset current passing through the phase change layer and the second lower electrode contact layer to change a portion of the phase change layer contacting the second lower electrode contact layer to an amorphous state.

22. A method of operating the PRAM device of claim 1, comprising applying a reset current passing through the phase change layer and the first lower electrode contact layer to change a portion of the phase change layer contacting the first lower electrode contact layer to an amorphous state.

23. The operating method of claim 22, wherein the reset current is smaller than a reset current used for a TiAlN lower electrode contact layer.

24. The operating method of claim 22, further comprising filling an upper end of the first lower electrode contact layer with the phase change layer.

25. The operating method of claim 22, further comprising forming the first lower electrode contact layer of one selected from the group consisting of an n-type SiGe layer, a PbTe layer and a cobalt silicon layer.

26. The operating method of claim 22, further comprising applying a set current passing through the phase change layer and the first lower electrode contact layer for a longer duration than the reset current after applying the reset current.

27. The operating method of claim 22, further comprising forming the first lower electrode contact layer of one selected from the group consisting of $Sb_2Te_3$, $Bi_2Te_3$, GeTe, PbTe, SnTe and an alloy thereof.

28. The operating method of claim 27, wherein the alloy is formed of at least two selected from a group consisting of Sb, Te, Bi, Ge, Pb and Sn.

29. The operating method of claim 28, wherein the alloy is doped with a desired amount of impurities.

* * * * *